US008884351B2

(12) United States Patent
Doebler

(10) Patent No.: US 8,884,351 B2
(45) Date of Patent: Nov. 11, 2014

(54) HYBRID ELECTRICAL CONTACTS

(71) Applicant: Micron Technology, Inc., Boise, ID (US)

(72) Inventor: Jonathan Doebler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/777,890

(22) Filed: Feb. 26, 2013

(65) Prior Publication Data

US 2013/0187212 A1 Jul. 25, 2013

Related U.S. Application Data

(60) Continuation of application No. 12/970,694, filed on Dec. 16, 2010, now Pat. No. 8,389,373, which is a division of application No. 11/400,348, filed on Apr. 7, 2006, now Pat. No. 7,863,663.

(51) Int. Cl.
*H01L 27/108* (2006.01)
*H01L 49/02* (2006.01)
*H01L 21/768* (2006.01)

(52) U.S. Cl.
CPC .......... *H01L 28/92* (2013.01); *H01L 21/76816* (2013.01); *H01L 28/90* (2013.01)
USPC .............. 257/306; 257/E21.11; 257/E29.346; 257/309

(58) Field of Classification Search
USPC ............ 257/306, E21.011, E29.346, E29.396
See application file for complete search history.

(56) References Cited

U.S. PATENT DOCUMENTS

| 5,708,559 | A | * | 1/1998 | Brabazon et al. | 361/313 |
|---|---|---|---|---|---|
| 6,271,084 | B1 | * | 8/2001 | Tu et al. | 438/253 |
| 6,544,840 | B2 | | 4/2003 | Sukekawa et al. | |
| 6,879,046 | B2 | | 4/2005 | Gibson et al. | |
| 6,967,150 | B2 | | 11/2005 | Yun et al. | |
| 6,974,774 | B1 | | 12/2005 | Dale | |
| 6,987,060 | B2 | | 1/2006 | Baek | |
| 6,987,296 | B2 | | 1/2006 | Kato | |
| 7,001,710 | B2 | | 2/2006 | Choi et al. | |
| 7,015,107 | B2 | | 3/2006 | Sugihara et al. | |
| 7,015,528 | B2 | | 3/2006 | McClure | |
| 7,189,613 | B2 | | 3/2007 | Tu | |
| 7,332,764 | B2 | * | 2/2008 | Choi et al. | 257/300 |
| 7,375,389 | B2 | | 5/2008 | Oh et al. | |
| 7,449,407 | B2 | | 11/2008 | Lur et al. | |
| 7,692,266 | B2 | | 4/2010 | Goebel et al. | |
| 2001/0046737 | A1 | * | 11/2001 | Ahn et al. | 438/253 |
| 2004/0173836 | A1 | * | 9/2004 | Oh et al. | 257/303 |
| 2006/0189072 | A1 | * | 8/2006 | Tu | 438/253 |

* cited by examiner

*Primary Examiner* — Timor Karimy
(74) *Attorney, Agent, or Firm* — Fletcher Yoder PC

(57) ABSTRACT

Devices having hybrid-vertical contacts. In certain embodiments, a substrate includes a lower patterned layer that has a target conductor. A hybrid-vertical contact may be disposed directly on the target conductor. The hybrid vertical contact may include a lower-vertical contact directly on the target conductor and an upper-vertical contact directly on the lower-vertical contact. The upper-vertical contact may have an upper width that is greater than a lower width of the lower-vertical contact.

23 Claims, 8 Drawing Sheets

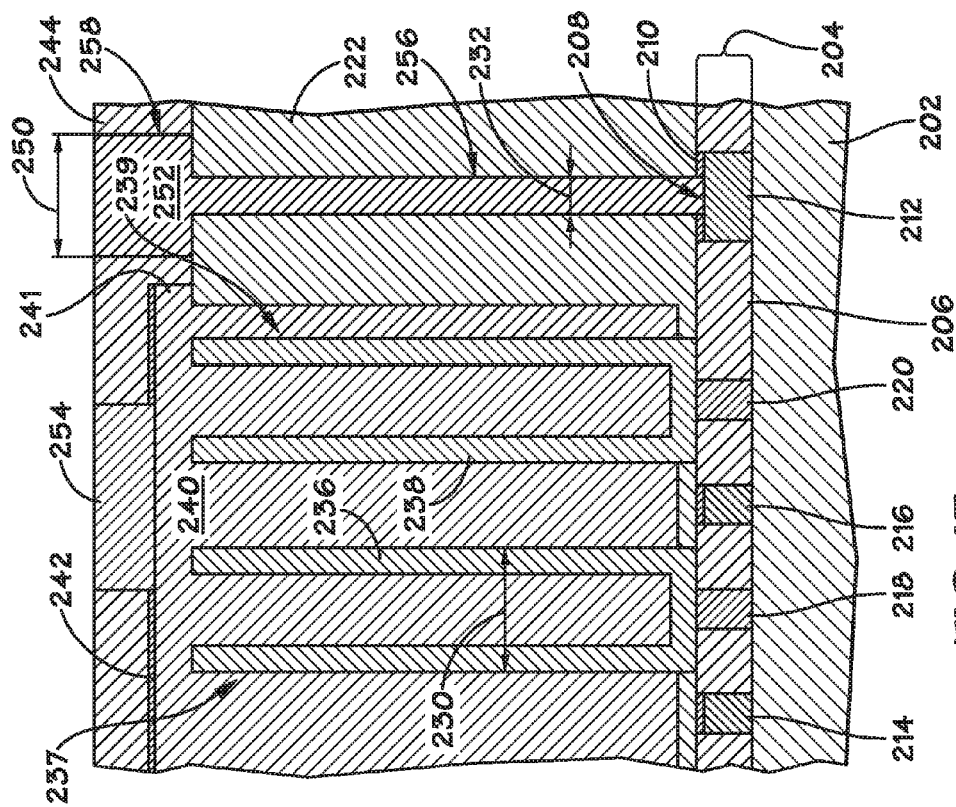
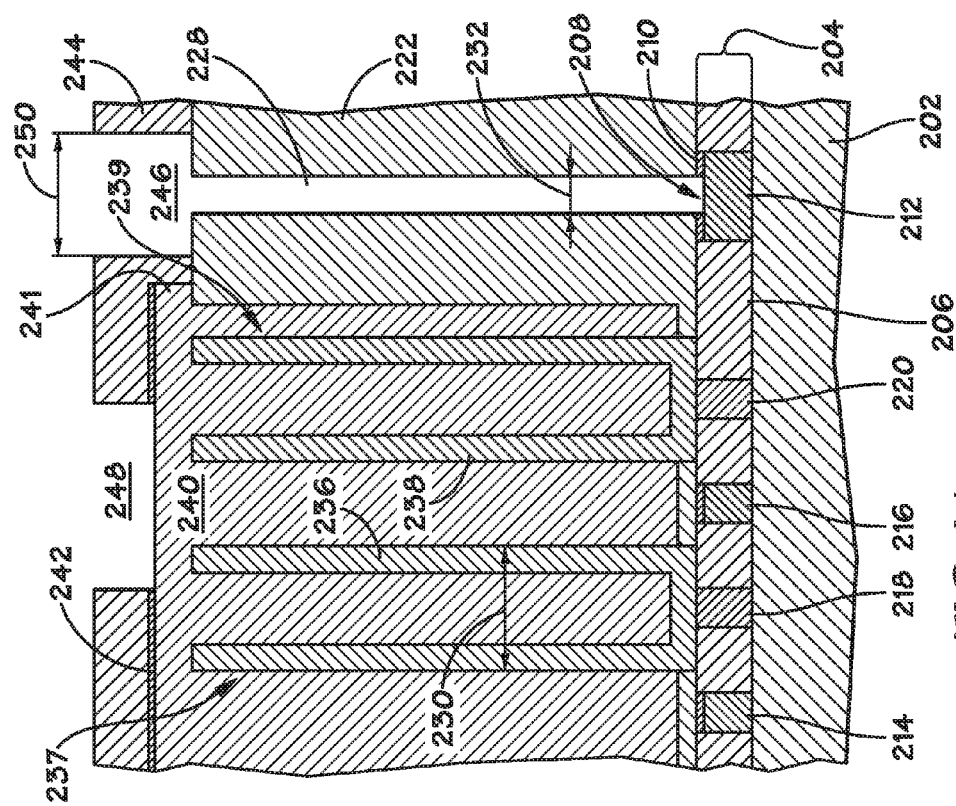

HYBRID ELECTRICAL CONTACTS

CROSS-REFERENCE TO RELATED APPLICATION

This Application is a Continuation of U.S. patent application Ser. No. 12/970,694, which was filed on Dec. 16, 2010, now U.S. Pat. No. 8,389,373, which issued on Mar. 5, 2013, which is a Divisional of U.S. patent application Ser. No. 11/400,348, which was filed on Apr. 7, 2006, now U.S. Pat. No. 7,863,663, which issued on Jan. 4, 2011.

BACKGROUND OF THE INVENTION

1. Field of the Invention

The present invention relates generally to methods of manufacturing semiconductor devices and, more specifically, to methods of patterning an electrical contact with different generations of lithography systems.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Semiconductor devices typically include a stratum of patterned layers. While each of the layers may serve different functions and comprise different materials, many of these layers are typically manufactured by performing some variant of three basic steps. First, a constituent material or materials are deposited on a substrate or underlying layer. Then, lithographic techniques are employed to form a patterned masking layer over the constituent materials. Finally, the underlying constituent materials that are exposed through the patterned masking layer are removed, thereby transferring the pattern of the masking layer to the constituent materials. To build a semiconductor device, this sequence of the steps is typically repeated a number of times to build up a series of layers.

Typically, lithography systems are employed to form the patterned masking layer. Generally, the lithography system applies a photoresist that chemically reacts when exposed to electromagnetic energy, such as ultraviolet light. After applying the photoresist, the photolithography system is employed to project an image corresponding to the desired pattern onto this layer of photoresist, through a photomask, for example. The image selectively exposes portions of the photoresist to electromagnetic energy, thereby causing these areas to chemically react and take on new properties. Generally, the photolithography system is used to develop the photoresist by selectively removing either areas of photoresist that were exposed to electromagnetic energy, in the case of a positive photoresist, or selectively removing areas of the resist that were not exposed to electromagnetic energy, in the case of negative photoresist. The resulting photorsists pattern forms a masking layer that generally corresponds to the image projected onto the photoresist.

Usually, it is important for the lithography system to precisely align to underlying layers before patterning the photoresist. For example, a vertical electrical contact between layers (hereinafter "contact") typically should align with some conductive feature (or "target conductor") in an underlying layer. Similarly, an electrical interconnect in the layer above the contact typically should align with that contact. In the present example, if each layer is properly aligned, the resulting contact will normally conduct current between the electrical interconnect and the target conductor. To this end, the photolithography system that patterns these features typically aligns with underlying layers before patterning the photoresist. Indeed, to facilitate alignment of layers, certain layers often include alignment marks. Generally, lithography systems patterning subsequent layers align to these marks before exposing the photoresist to electromagnetic radiation.

Often, to reduce costs, a single semiconductor manufacturing line will employ multiple generations of lithography systems. Typically, newer generations of lithography systems are much more expensive than older generation lithography systems. Thus, the capital equipment costs of a manufacturing line can typically be lowered by performing manufacturing steps on older generation lithography systems instead of newer generation lithography systems. At the same time, the newer generations of lithography systems are generally capable of patterning smaller features with tighter tolerances and more precise alignment to underlying layers than older generation lithography systems. As a result of these competing concerns of cost and performance, in a typical manufacturing line, the newer generation lithography systems are often reserved for critical layers, while the older generation lithography systems pattern less critical layers with larger features and less exacting tolerances.

Aligning the various layers in a semiconductor device presents difficulties in a manufacturing line that includes multiple generations of lithography systems. Unfortunately, it is difficult to precisely align the older generation lithography systems to layers patterned by the newer generation lithography systems. Consequently, when a contact and a target conductor are patterned with different generations of lithography systems, manufacturing lines may suffer lower yields due to misalignment of the contacts and the target conductors. Thus, there is a need for a method of electrically connecting a layer formed with an older generation lithography system to a layer formed with a newer generation lithography system.

BRIEF DESCRIPTION OF THE DRAWINGS

Advantages of the invention may become apparent upon reading the following detailed description and upon reference to the drawings, in which:

FIG. 14 depicts the film stack of FIG. 13 after the removal of a cap layer at the bottom of the lower contact recess, which may be used to manufacture an electronic device in accordance with embodiments of the present invention; and FIG. 15 depicts an exemplary hybrid contact formed within the film stack of FIG. 14, which may be used to manufacture an electronic device in accordance with embodiments of the present invention.

DETAILED DESCRIPTION OF SPECIFIC EMBODIMENTS

Figure 1:
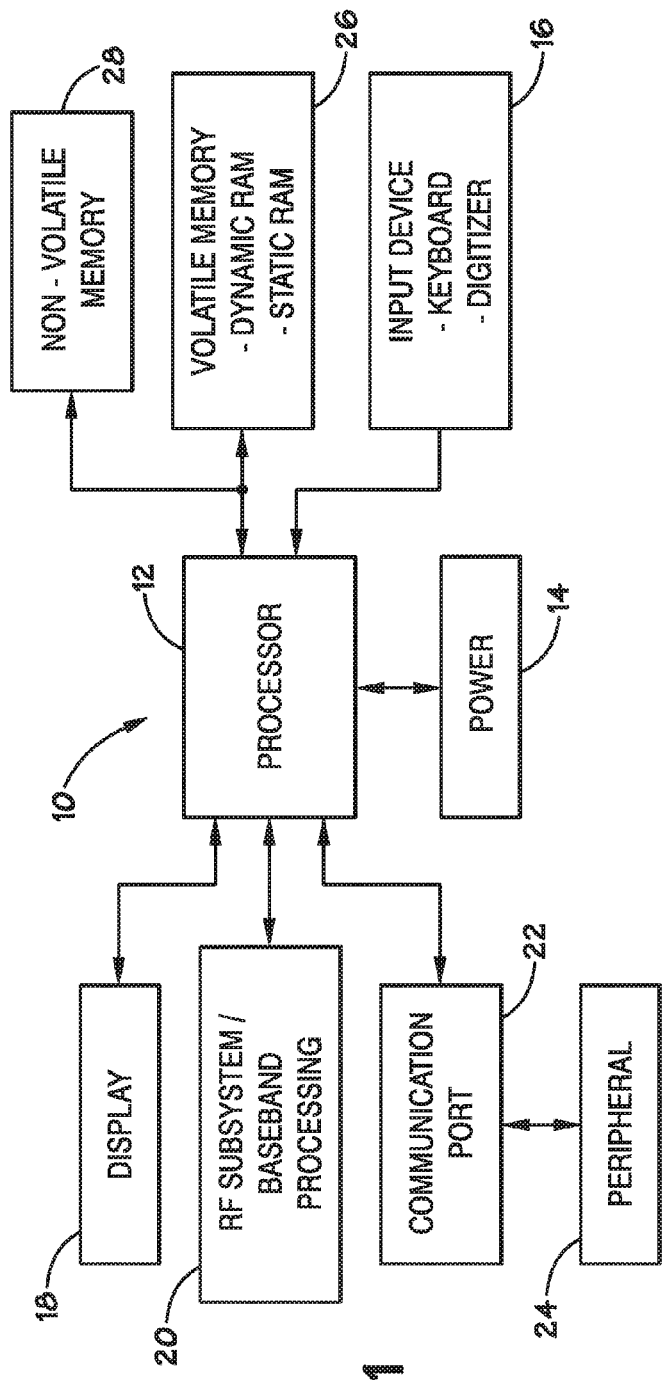
FIG. 1 illustrates a block diagram of an exemplary processor-based system in accordance with embodiments of the present invention.

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

As discussed above, aligning a contact with a target conductor may present difficulties when different generations of lithography systems pattern the target conductor and the contact. Some techniques that might alleviate these difficulties may also increase manufacturing costs. For instance, the target conductor may be made larger to increase the margin for error in alignment between layers. However, this technique consumes valuable substrate surface area, resulting in fewer chips on the wafer and potentially higher manufacturing costs on a per-chip basis. Alternatively, or additionally, the same generation of lithography system may be used to pattern both the target conductor and the contact. However, when the target conductor is patterned with a newer generation lithography system, this technique increases the number of layers patterned with newer generation lithography system and potentially increases capital equipment costs.

Certain embodiments of the present invention may address some of these issues. As is described in more detail below, in some embodiments, a lower portion of a contact may be patterned with a newer generation lithography system while concurrently patterning some intermediate layer between the target conductor and the overlying interconnect to which the contact connects. If the intermediate layer includes critical features, the marginal cost of patterning the lower portion of the contact along with the critical features may be very low, as the newer generation of lithography system would likely be used to pattern this layer anyway. Further, by forming and aligning a lower portion of the contact in advance with a newer generation lithography system, an older generation of lithography system may form an upper portion of the contact without precisely aligning to the target conductor. Advantageously, older, often fully depreciated, and typically less expensive, lithography systems may be used to pattern more layers of the electronic devices. Consequently, embodiments of the present technique may reduce manufacturing costs.

As is described below, an exemplary two-stage contact formation process may be used to form a hybrid contact. A subsequently discussed exemplary hybrid contact includes a lower portion formed with a newer generation of lithography system and an upper portion formed with an older generation of lithography system. As used herein, the term "hybrid contact" refers to a contact including portions formed by lithography systems of different generations. Lithography systems of different generations typically have different resolution and/or alignment capabilities, as is explained in more detail below. In the exemplary two-stage contact formation process, certain less critical features, wherein resolution and/or alignment are less of a factor, may be formed with older generation lithography systems, which may be cheaper, and certain critical features may be formed with newer generation lithography systems.

The following discussion describes exemplary embodiments of the present technique. First, several terms used herein are explained. Following the term explanations, the discussion outlines exemplary systems that may be manufactured in accordance with embodiments of the present technique. Finally, a manufacturing process and resulting structure in accordance with embodiments of the present technique are described.

As used herein, the term "layer" includes a film stack with a common feature, function, and/or material, depending on how the term layer is modified. When the term "layer" is modified by a specific material, e.g. an "oxide layer," the resulting term encompasses, inter alia, the result of both multiple, consecutive depositions of generally similar materials without an intervening patterning step and a single deposition of a generally uniform material. Further, as used herein, the term "deposition" includes, in addition to the application of some material, growth of a material in an existing layer, such as growth of silicon dioxide in a silicon substrate, for example.

Additionally, as used herein, the term "on" is used to indicate a physical proximity at least partially above some other feature but not necessarily in contact with the other feature. For example, if a first layer is said to be "deposited on" a substrate, the layer may be deposited in contact with the substrate or intervening layers may exist between the first layer and the substrate. The term "directly on" is used to indicate a position at least partially above some other feature and in contact with that feature, e.g., with no intervening layers. The term "entirely on" is used to indicate a position wholly above some other feature, i.e., without overhanging the other feature.

Turning to the figures, FIG. 1 depicts an exemplary processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained in greater detail below, the processor may include structures manufactured in accordance with embodiments of the present technique.

The system 10 typically includes a power supply 14. For instance, if the system 10 is a portable system, the power supply 14 may advantageously include a fuel cell, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 is typically large so that it can store dynamically loaded applications and data. As described further below, the volatile memory 26 may be configured in accordance with embodiments of the present invention.

The processor 12 may also be coupled to non-volatile memory 28. The non-volatile memory 28 may include a read-only memory (ROM), such as an EPROM, and/or flash memory to be used in conjunction with the volatile memory 26. The size of the ROM is typically selected to be just large enough to store any necessary operating system, application programs, and fixed data. Additionally, the non-volatile memory 28 may include a high capacity memory such as a tape or disk drive memory. As is explained in greater detail below, the non-volatile memory may include electronic devices manufactured in accordance with embodiments of the present technique.

Figure 2:
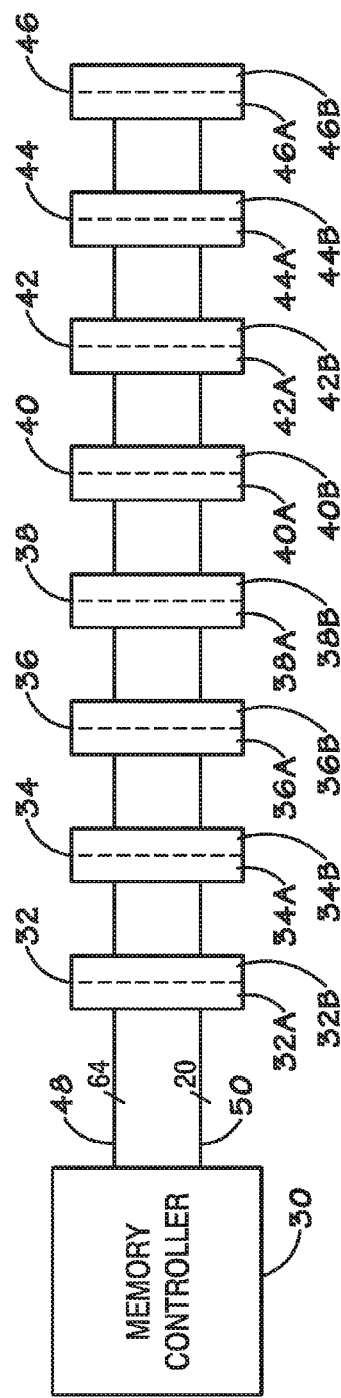
FIG. 2 illustrates an exemplary memory sub-system in accordance with embodiments of the present invention.

FIG. 2 generally illustrates a block diagram of a portion of a memory sub-system, such as the volatile memory 26. A memory controller 30 is generally provided to facilitate access to storage devices in the volatile memory 26. The memory controller 30 may receive requests to access the storage devices via one or more processors, such as the processor 12, via peripheral devices, such as the peripheral device 24, and/or via other systems (not shown). The memory controller 30 is generally tasked with facilitating the execution of the requests to the memory devices and coordinating the exchange of information, including configuration information, to and from the memory devices.

The memory sub-system may include a plurality of slots 32-46. Each slot 32-46 is configured to operably couple a memory module, such as a dual-inline memory module (DIMM), to the memory controller 30 via one or more memory buses. Each DIMM generally includes a plurality of memory devices such as dynamic random access memory (DRAM) devices capable of storing data, as described further below with reference to FIG. 3. As described further below, each DIMM has a number of memory devices on each side of the module. Each side of the module may be referred to as a "rank." Accordingly, each exemplary slot 32-46 is configured to receive a single DIMM having two ranks. For instance, the slot 32 is configured to receive a DIMM having ranks 32A and 32B, the slot 34 is configured to receive a DIMM having ranks 34A and 34B, and so forth. In the present exemplary embodiment, each of the eight memory slots 32-46 is capable of supporting a module comprising eight individual memory devices on each rank 32A/B-46A/B, as best illustrated with respect to FIG. 3, described further below.

Referring again to FIG. 2, the memory buses may include a memory data bus 48 to facilitate the exchange of data between each memory device on the DIMMs and the memory controller 30. The memory data bus 48 comprises a plurality of single bit data buses, or transmission lines, each coupled from the memory controller 30 to a memory device. In one embodiment of the volatile memory 26, the memory data bus 48 may include 64 individual data buses. Further, the memory data bus 48 may include one or more individual buses to each memory rank 32A/B-46A/B which may be used for ECC error detection and correction. As can be appreciated by those skilled in the art, the individual buses of the memory data bus 48 will vary depending on the configuration and capabilities of the system 10.

The volatile memory 26 also includes a command bus 50 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described with reference to the memory data bus 48, a variety of embodiments may be implemented for the command bus 50 depending on the system configuration.

Figure 3:
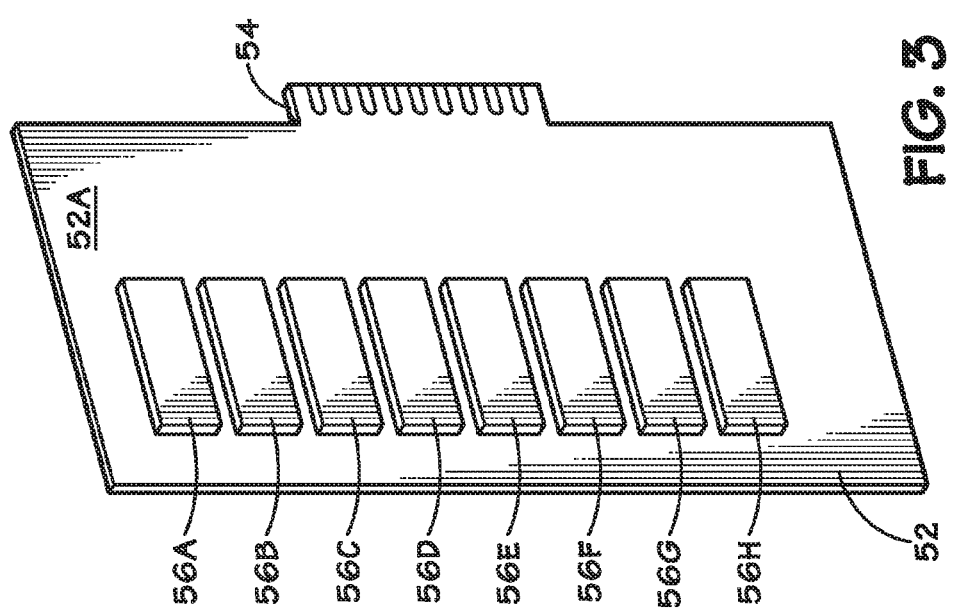
FIG. 3 illustrates an exemplary memory module in accordance with embodiments of the present invention.

FIG. 3 illustrates exemplary memory module 52, such as a DIMM, that may be inserted into one of the memory slots 32-46 (FIG. 2). In the present exemplary views, one side of the memory module 52 is illustrated, and generally designated as the rank 52A. As previously discussed, the memory module 52 may include two ranks 52A and 52B. The rank 52A includes a plurality of memory devices 56A-56H, such as dynamic random access memory (DRAM) devices, which may be used for storing information. As will be appreciated, the second opposing side of the memory module 52 (52B, not shown) also includes a number of memory devices. The memory module 52 may include an edge connector 54 to facilitate mechanical coupling of the memory module 52 into one of the memory slots 32-46. Further, the edge connector 54 provides a mechanism for electrical coupling to facilitate the exchange of data and control signals from the memory controller 30 to the memory devices 56A-56H (and the memory devices on the second ranks). The embodiment of FIG. 3 may be employed in accordance with various standards. For instance, the memory module 52 may be employed in a single data rate (SDR), fully buffered (FB)-DIMM, double data rate (DDR), and double data rate 2 (DDR2) system 10.

The memory devices 56A-56H may each include an array of cells (not shown) that each include a transistor and a capacitor. In certain embodiments, at least a portion of the cells may be manufactured in accordance with an exemplary two-stage contact formation process that results in an exemplary hybrid contact.

Figure 4:
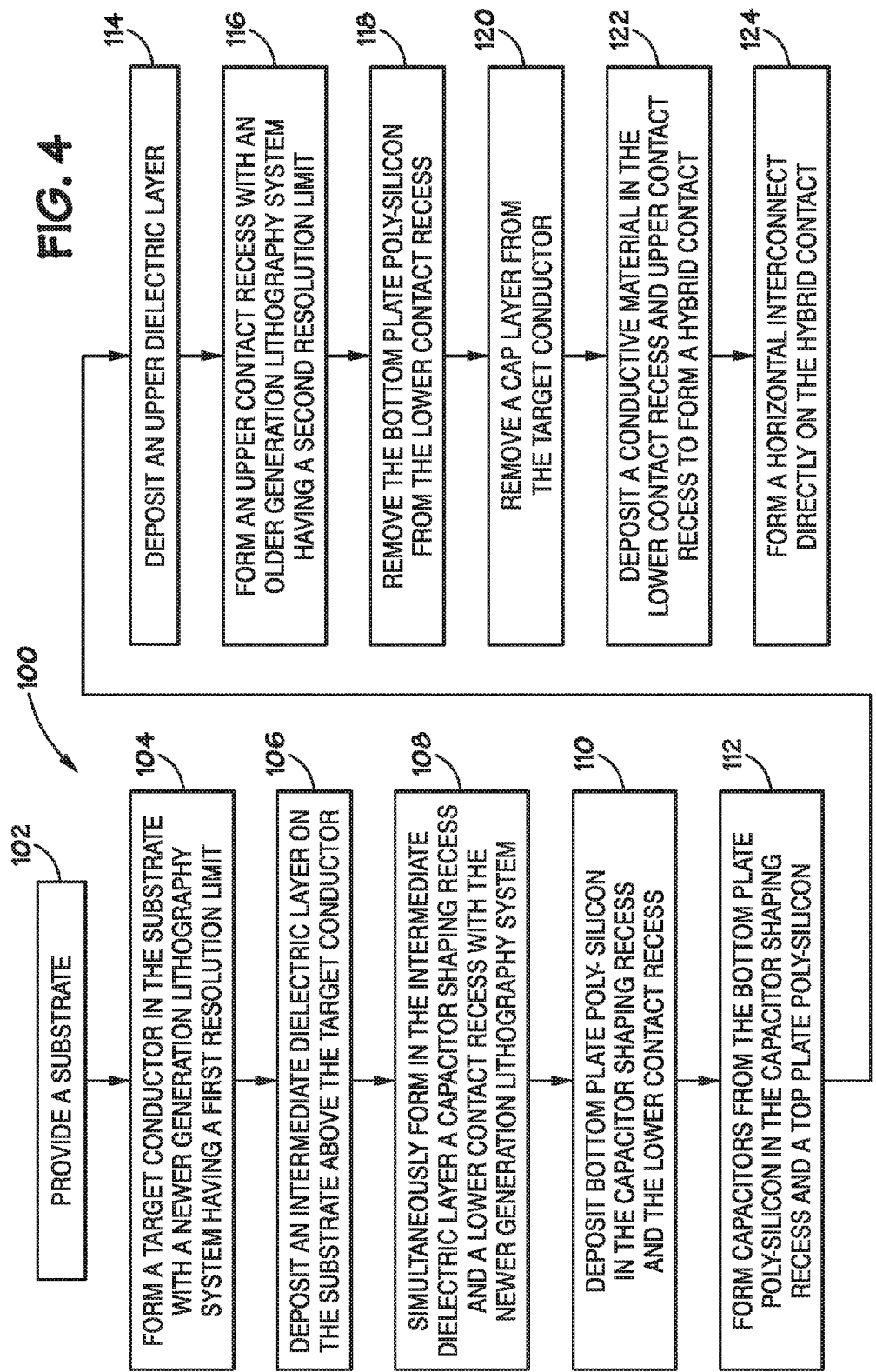
FIG. 4 is a flow chart depicting an exemplary two-stage contact formation process in accordance with embodiments of the present invention.

FIG. 4 is a flow chart illustrating an exemplary two-stage contact manufacturing process 100 (hereinafter the "exemplary process"). As is explained in greater detail below with reference to FIGS. 4-15, execution of the exemplary process 100 may result in the formation of a hybrid contact between and/or within layers patterned with different generations of lithography systems. Before outlining the steps of the exemplary process 100, it should be noted that, while the following discussion proceeds through the steps of the exemplary process 100 in sequence, the sequence is itself exemplary, and other embodiments in accordance with the present technique may employ a different sequence.

Figure 5:
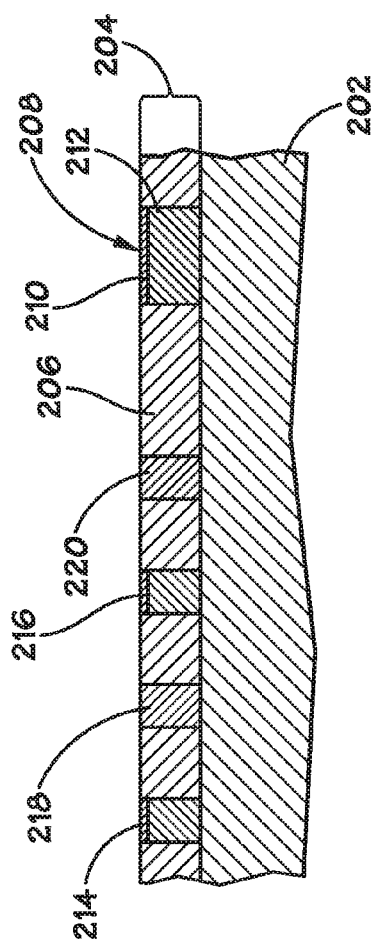
FIG. 5 illustrates a substrate and an initial patterned layer that may be used to manufacture an electronic device in accordance with embodiments of the present invention.

With reference to FIGS. 4 and 5, the exemplary process 100 begins with providing a substrate 202, as depicted by block 102 in FIG. 4, and forming a target conductor 208 in or on the substrate 202, as depicted by block 104 in FIG. 4. The substrate 202 may include bulk semiconductor material such as single crystal silicon, polycrystal silicon, gallium arsenide, indium phosphide, or other materials with semiconductor properties. Alternatively, or additionally, the substrate 202 may include a non-semiconductor surface on which an electronic device may be constructed, such as a plastic or ceramic work surface, for example. The substrate 202 may be in the form of a whole wafer, a diced wafer, or a portion of a diced wafer in a packaged electronic device.

The target conductor 208 may be part of an initial patterned layer 204 on or in the substrate 202. In the present embodiment, the initial patterned layer 204 includes a lower dielectric 206 that isolates the target conductor 208. The lower dielectric 206 may include boro-phospho-silicate glass (BPSG), silicon dioxide, silicon nitride, spin-on glass, fluorinated silica glass, porous dielectric materials, an air gap, high density plasma (HDP) oxide, or other dielectric materials, for example. The target conductor 208 may include a silicon nitride cap 210 over a conductive local interconnect 212 to protect the local interconnect 212 during subsequent etching steps. However, it should be noted that certain embodiments in accordance with the present technique may not include the cap layer 210, which is not to suggest that other features of the present embodiment may not also be omitted in accordance with the present techniques. The local interconnect 212 may carry current generally horizontally mostly within a single layer, such as the initial patterned layer 204. In some embodiments, the local interconnect 212 may be a buried word line or a buried digit line. Alternatively, the target conductor 208 may be a doped region of the substrate 202, such as a source, drain, or conductive channel, for example, or the target conductor 208 may be a conductive plug or contact that carries current generally vertically. The initial pattern layer 204 may also include interconnects 214 and 216 and capacitor plugs 218 and 220 for accessing subsequently discussed memory elements.

As depicted by block 104 in FIG. 4, the target conductor 208 may be formed with a newer generation lithography system having a first resolution limit. As used herein, the term "newer" is intended to distinguish a generation of lithography systems developed subsequent to the development of an earlier generation of lithography systems, i.e., an "older" generation of lithography system. Newer generations of lithography systems may have better resolution and/or alignment capabilities than older generations of lithography systems. The terms "newer" and "older" indicate the relative chronological relationship of generations of lithography systems and not the absolute chronological relationship of a generation of lithography systems to some fixed point in time. In other words, today's "newer" generation of lithography system may be tomorrow's "older" generation of lithography system.

In the present embodiment, the newer generation lithography system is a 193-nanometer lithography system. However, other embodiments may employ other types of lithography systems, such as a 157-nanometer lithography system, a 248-nanometer lithography system, an immersion lithography system, a high-index immersion lithography system, a nano imprint system, an e-beam system, or other system for patterning layers of an electronic or optical device, for example.

Figure 6:
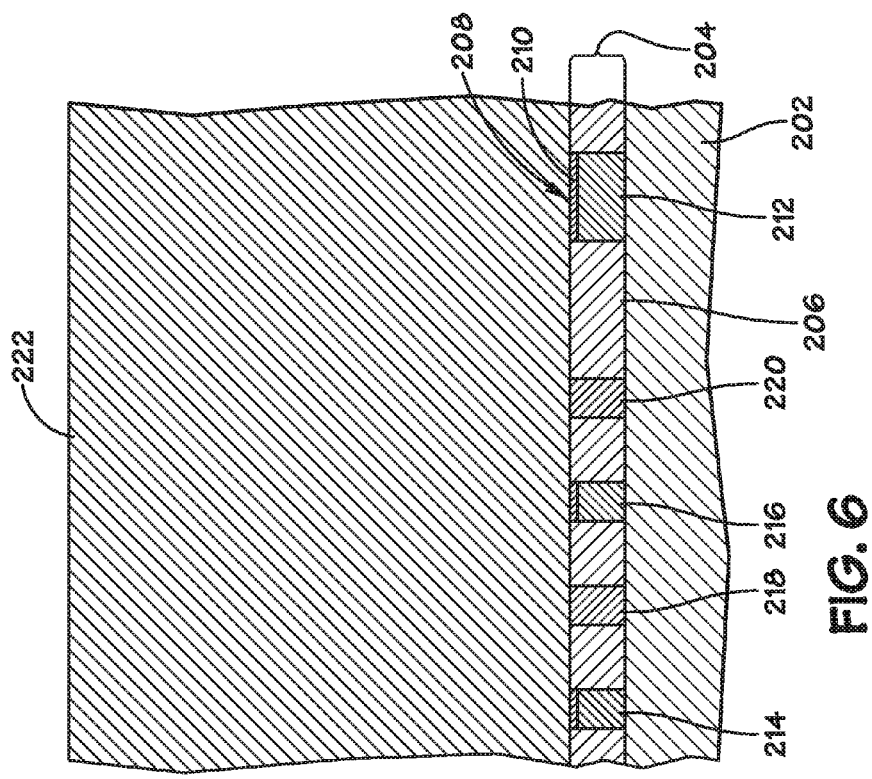
FIG. 6 illustrates the film stack of FIG. 5 after deposition of an intermediate dielectric layer, which may be used to manufacture an electronic device in accordance with embodiments of the present invention.

With reference to FIGS. 4 and 6, the exemplary process 100 may include depositing an intermediate dielectric layer 222 on the substrate 202, above the target conductor 208, as depicted by block 106 in FIG. 4. The intermediate dielectric layer 222 may include any of the dielectric materials previously listed in reference to the lower dielectric layer 206. As explained below, the intermediate dielectric layer 222 may be used to form capacitors over the capacitor plugs 218 and 220. Alternatively, or additionally, the intermediate dielectric layer may be used to form other critical features, such as a gate stack, interconnect, contact, plug, active area, or mask for doping a region of the substrate. In the some embodiments, there are no horizontal interconnects in layers between the intermediate dielectric layer 222 and the target conductor 208 that directly electrically connect to the target conductor 208. In the present embodiment, the intermediate dielectric layer 222 is over 1.0 micron thick. However, other embodiments may include intermediate dielectric layers that are more than 3.0 microns thick, 2.5 microns thick, 2.0 microns thick, 1.5 microns thick, 0.5 microns thick, or 0.25 microns thick, or less, for instance.

Figure 7:
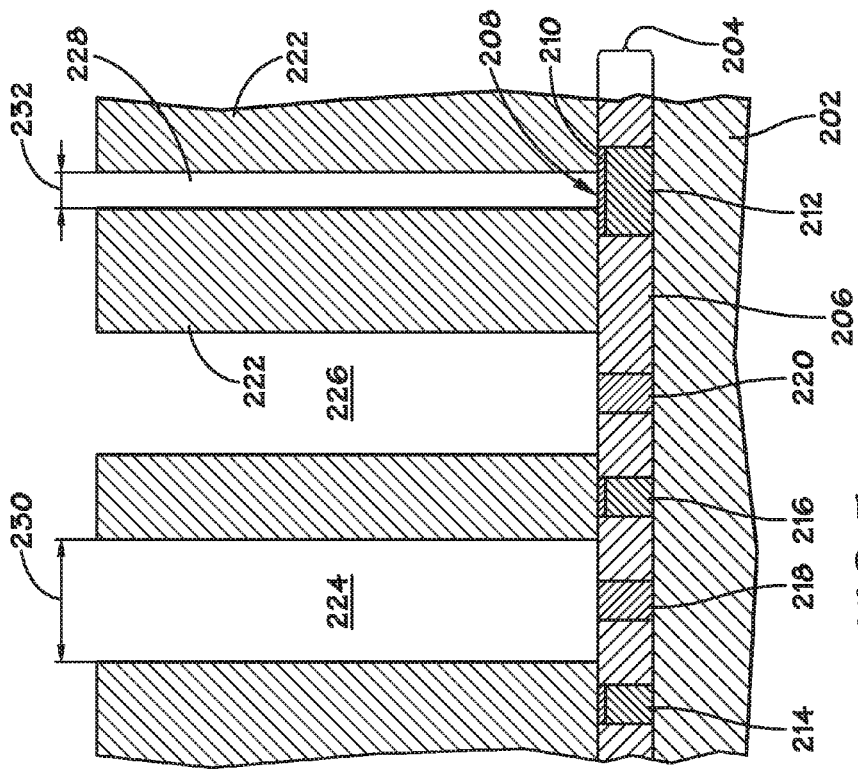
FIG. 7 illustrates the film stack of FIG. 6 after formation of capacitor shaping recesses and a lower contact recess in the film stack of FIG. 6, which may be used to manufacture an electronic device in accordance with embodiments of the present invention.

Turning to FIG. 7, capacitor shaping recesses 224 and 226 and lower contact recess 228 may be simultaneously formed in the intermediate dielectric layer 222, as depicted by block 108 in FIG. 4. The capacitor shaping recesses 224 and 226 have a capacitor width 230, which generally defines the width of a bottom capacitor plate, and the lower contact recess 228 has a lower contact width 232.

In the present exemplary process 100, the capacitor shaping recesses 224 and 226 and lower contact recess 228 may be patterned generally simultaneously with the newer generation lithography system that was used to pattern the target conductor 108. Alternatively, these features may be formed with a different lithography system having generally the same resolution limit as the lithography system that was used to pattern the target conductor 108 or a different lithography system of generally the same generation as the lithography system employed to form the target conductor 108. Advantageously, in the present embodiment, the lithography system that was used to pattern the target conductor 208 is also used to pattern the lower contact recess 228. Patterning these layers with the same or similar lithography systems may facilitate alignment of the lower contact recess 228 over the target conductor 208. Further, because the capacitor shaping recesses 224 and 226 are typically critical features, a newer generation lithography system would likely be used to pattern this layer regardless of if lower contact recess 228 is patterned at the same time. Consequently, the marginal cost of patterning the lower contact recess 228 with a newer generation lithography system may be very low.

However, it should be noted that in other embodiments the capacitor shaping recesses 224 and 226 are formed at a different times and/or with a different lithography system than the lower contact recess 228. Indeed, in certain embodiments in accordance with the present technique, the capacitor shaping recesses 224 and 226 are not formed at all and/or some other critical feature is formed in the intermediate dielectric 222 along with the lower contact recess 228, such as a gate, plug, interconnect, and/or some other feature of a volatile or non-volatile memory element or other electronic or optical device.

Figure 8:
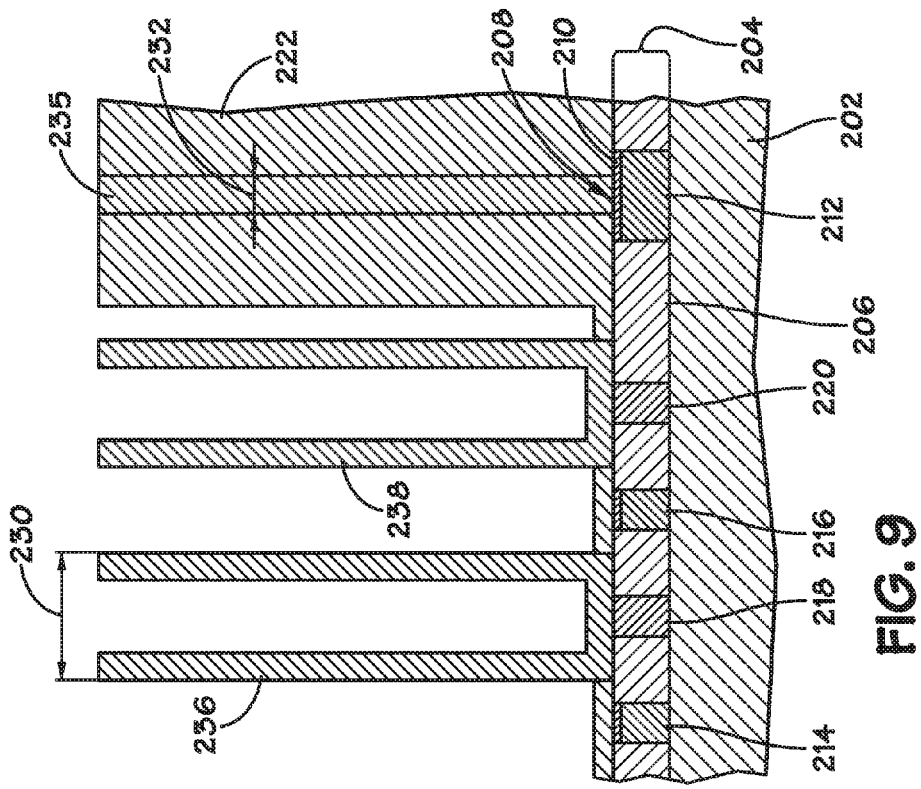
FIG. 8 illustrates the film stack of FIG. 7 after formation of bottom capacitor plates, which may be used to manufacture an electronic device in accordance with embodiments of the present invention.

Next in the exemplary process 100, bottom plate poly-silicon is deposited on the film stack of FIG. 7, as depicted by block 110 in FIG. 4 and illustrated in FIG. 8. The bottom plate poly-silicon 234 may conform to the shape of the capacitor shaping recesses 224 and 226 and at least partially fill the lower contact recess 228. In the present embodiment, the bottom plate poly-silicon 234 is removed from the top of the intermediate dielectric layer 222 with a chemical mechanical planarization process or an etch-back process. Removal of the bottom plate poly-silicon 234 from the top of the intermediate dielectric layer 222 may result in the formation of bottom capacitor plates 236 and 238 and residual plug 235 depicted in FIG. 9. The bottom plate poly-silicon 234 may be doped to increase its conductivity. Alternatively, other conductive materials may be used in place of, or in addition to, the bottom plate poly-silicon 234.

Figure 9:
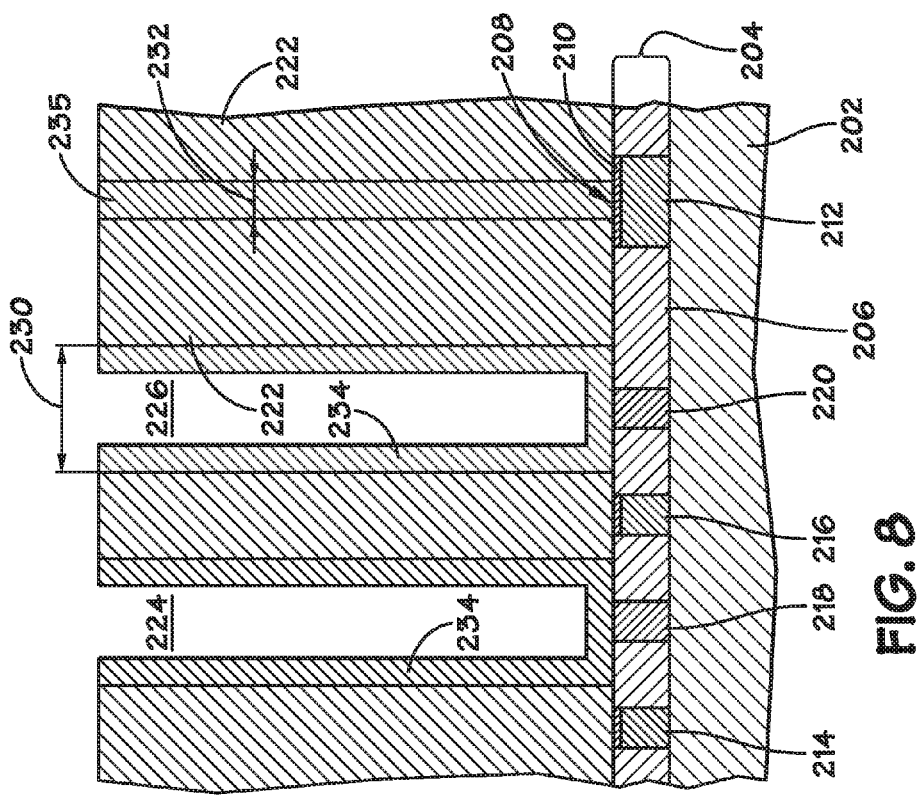
FIG. 9 depicts the film stack of FIG. 8 after etching the intermediate dielectric to expose the bottom capacitor plates, which may be used to manufacture an electronic device in accordance with embodiments of the present invention.
Figure 10:
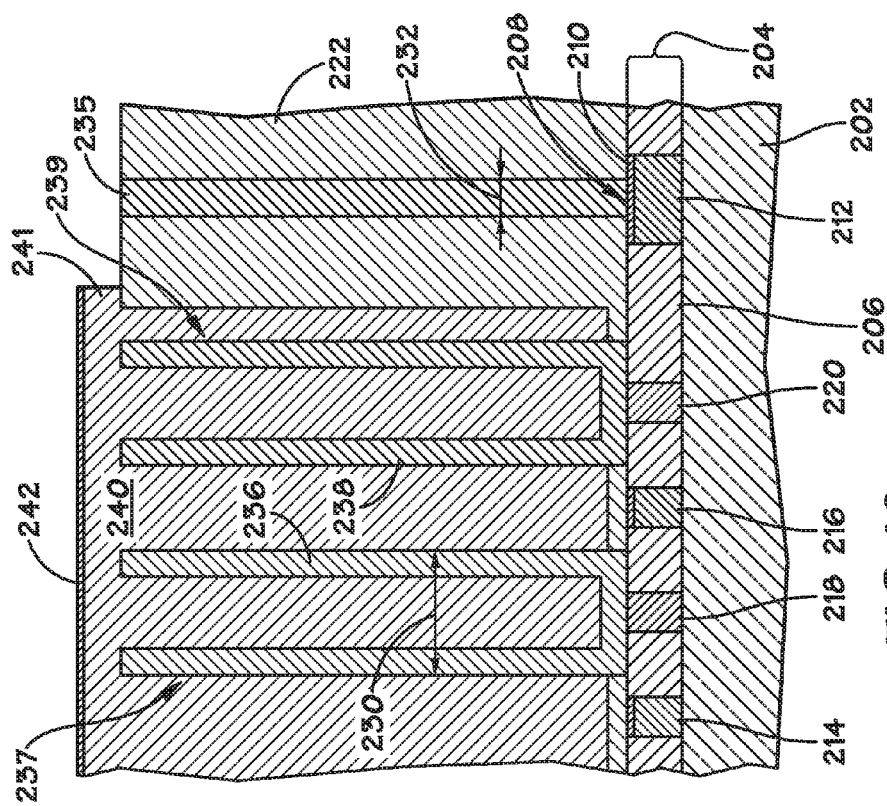
FIG. 10 depicts the film stack of FIG. 9 after the deposition and patterning of a top capacitor plate, which may be used to manufacture an electronic device in accordance with embodiments of the present invention.

With reference to FIGS. 4, 9 and 10, the exemplary process 100 includes forming capacitors 237 and 239 from the bottom plate poly-silicon 234 and a top plate poly-silicon 240, as depicted by block 112 in FIG. 4. In the present embodiment, the intermediate dielectric layer 222 is patterned and etched in the region surrounding the lower contact recesses 224 and 226 to form bottom capacitor plates 236 and 238, as depicted in FIG. 9. The height of the bottom capacitor plates 236 and 238 may generally correspond to the thickness of the intermediate dielectric 222, and the width of the bottom capacitor plates 236 and 238 may generally correspond to the width 230 of the capacitor shaping recesses 224 and 226. The bottom capacitor plates 236 and 238 may generally align with and contact capacitor plugs 218 and 220, respectively.

Next, as depicted by FIG. 10, a thin capacitor dielectric layer (not shown) is deposited on the bottom capacitor plates 236 and 238 and a common, top capacitor plate poly-silicon 240 is deposited to form capacitors 237 and 239. The top capacitor plate poly-silicon 240 is patterned and etched to form a top capacitor plate 241. The top capacitor plate 241 includes a cap layer 242 to protect the top capacitor plate 241 during subsequent etches.

Figure 11:
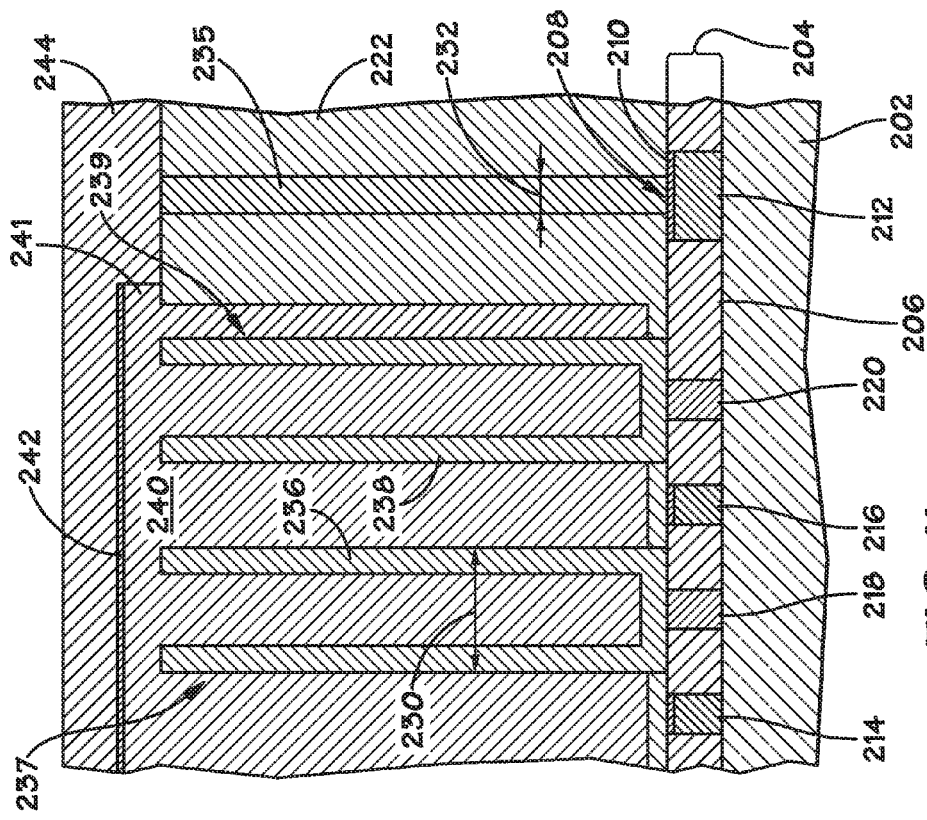
FIG. 11 depicts the film stack of FIG. 10 after deposition of an upper dielectric layer, which may be used to manufacture an electronic device in accordance with embodiments of the present invention.

Turning to FIG. 11 and block 114 of FIG. 4, next in the exemplary process 100, an upper dielectric 244 may be deposited on the film stack depicted by FIG. 10. The upper dielectric 244 may include any of the dielectric materials discussed in reference to the lower dielectric 206. In the present embodiment, the upper dielectric 244 is directly on the intermediate dielectric 222, at least near the residual plug 235, but other embodiments in accordance with the present technique may include intervening films.

Figure 12:
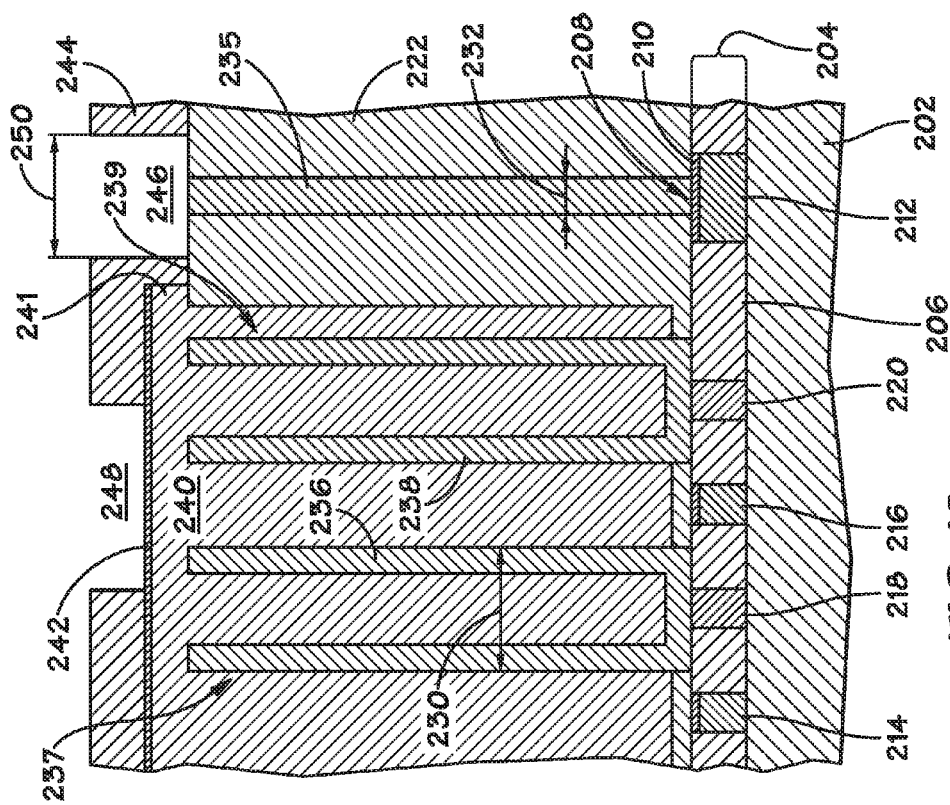
FIG. 12 depicts the film stack of FIG. 11 after formation of an upper contact recess, which may be used to manufacture an electronic device in accordance with embodiments of the present invention.

In the present exemplary process 100, an upper contact recess 246 and plate contact recess 248 may be generally simultaneously formed in the upper dielectric layer 244, as depicted by block 116 in FIG. 4 and FIG. 12. The upper contact recess 246 generally aligns with the residual plug 235. To increase the margin of error when aligning the upper contact recess 246 with the residual plug 235, the upper contact recess 246 may have an upper contact width 250 that is wider than the lower contact width 232. In the present embodiment, the upper contact recess 246 has an upper contact width 250 that is at least 2.0 times the size of the lower contact width 232. However, other embodiments in accordance with the present technique may feature an upper contact width 250 that is at least 1.0, 1.2, 1.5, 1.8, 2.5, 3.0, 4.0, 5.0, 6.0, 7.0, 8.0, 9.0, or 10.0 times the size of the lower contact width. While the illustrated upper contact recess 246 extends through the upper dielectric 244 to the intermediate dielectric 222, in other embodiments the upper contact recess 246 extends into the intermediate dielectric 222. The alignment tolerance of the upper contact recess to the lower contact recess may be at least 1.1, 1.2, 1.5, 1.7, 2.0, 3.0, or 5.0 times the alignment tolerance of the residual plug 235, or the lower contact recess 228, to the target conductor 208.

The upper contact recess 246 may be formed with an older generation lithography system having a second resolution limit. The older generation lithography system may be a lithography system developed earlier than the newer generation lithography system used to form the lower contact recess 228 and/or the target conductor 208. Alternatively, or additionally, the older generation lithography system may have a second resolution limit greater, i.e., larger, than the resolution limit of the newer generation lithography system. In the present embodiment, the older generation lithography system is a 248-nanometer lithography system, but other embodiments in accordance with the present technique may employ a 308-nanometer lithography system, a 351-nanometer lithography system, a 157-nanometer lithography system, an immersion lithography system, a high-index immersion lithography system, a nano imprint system, an e-beam system, or other system for patterning layers of an electronic or optical device, for example. Advantageously, patterning the upper contact recess 246 with an older generation lithography system may reduce capital equipment costs by reducing the number of typically more expensive newer generation lithography systems in a manufacturing line.

The upper contact recess 246 may be patterned substantially simultaneously with the plate contact recess 248, using the same lithography system. However, other embodiments in accordance with the present technique may form these features at different times, with different lithography systems, or not form the plate contact recess 248 at all.

Figure 13:
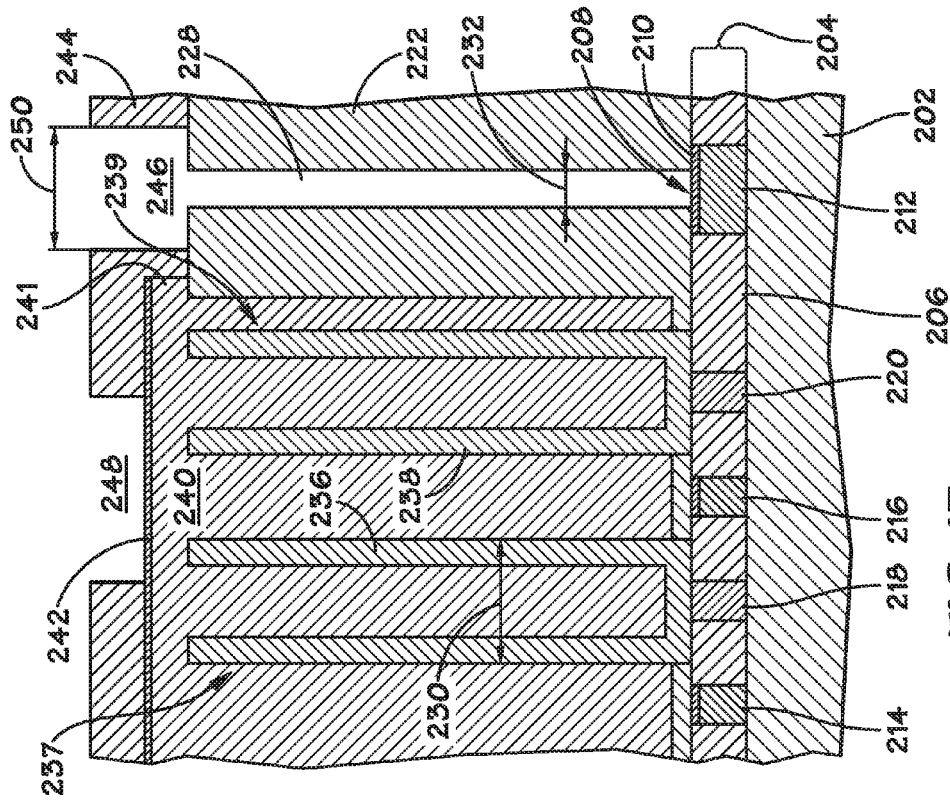
FIG. 13 depicts the film stack of FIG. 12 after removal of bottom capacitor plate material from the lower contact recess, which may be used to manufacture an electronic device in accordance with embodiments of the present invention.

To re-open the lower contact recess 228, the residual plug 235 may be removed, as depicted by FIG. 13 and block 118 of FIG. 4. In the present embodiment, the residual plug 235 is removed with a wet etch that stops at the cap layer 210. Similarly, the top capacitor plate cap 242 may protect the upper capacitor plate 240 during this step. Alternatively, the residual plug 235 may remain in the lower contact recess 228 to form a lower portion of a hybrid contact.

Next, as depicted by FIG. 14 and block 120 of FIG. 4, the cap 210 and top capacitor plate cap 242 may be removed with an etch to expose the interconnect 212 and upper capacitor plate 240, respectively. However, it should be noted that in other embodiments these cap layers 210 and 242 may be omitted, in which case this step may also be omitted. It is important to note that, while this step has been explicitly identified as optional, other steps in the present exemplary embodiment may also be omitted in accordance with embodiments of the present technique.

Finally, turning to FIG. 15, an exemplary hybrid contact 252 may be formed in the lower contact recess 228 and upper contact recess 246, as depicted by block 122 in FIG. 4. The exemplary hybrid contact 252 may include an exemplary lower vertical contact 256 generally filling the lower contact recess 228 and an upper vertical contact 258 generally filling the upper contact recess 246. In the present embodiment, the hybrid contact 252 may include a titanium layer, a titanium nitride layer, and a tungsten layer, all conformably deposited with chemical vapor deposition. Alternatively, one or more of these films may be sputtered. Also in the present embodiment, a plate contact 248 may be formed simultaneously in the plate contact recess 248 to electrically contact the top plate 341. In certain embodiments, a chemical mechanical planarization step or etch-back step may remove excess material that is external to the plate contact recess 248, lower contact recess 228, and upper contact recess 246.

The upper vertical contact 258 may have the same generally shape as the lower vertical contact 256 or it may have a different shape. In certain embodiments, either one of or both of the upper vertical contact 258 and the lower vertical contact 256 may be a generally right-cylindrical volume with an axis of rotational symmetry that is generally perpendicular to the substrate. Alternatively, either one of or both of the upper vertical contact 258 and the lower vertical contact 256 may be a generally right-elliptical volume with a generatrix extending perpendicular to the substrate. In some embodiments, either one of or both of the upper vertical contact 258 and the lower vertical contact 256 may be some other volume with larger vertical dimensions than horizontal dimensions, for example.

Advantageously, various features may be formed above the hybrid contact 252 that are electrically coupled to the target conductor 208. For example, a metal layer interconnect (not shown) may be formed on or directly on the hybrid contact 252, as depicted by block 124 in FIG. 4. Similarly, a strapping layer (not shown) may be formed on or directly on the plate contact 254. In operation, the first metal layer interconnect may carry current generally horizontally above the substrate 202, and the strapping layer may lower resistance to the upper capacitor plate 240. Alternatively, another contact, plug, interconnect, pad, or other conductor may be formed on or directly on the hybrid contact 252 and placed in electrical communication with the target conductor 208.

In operation, current flows through the hybrid contact 252 to and/or from the target conductor 208. In some exemplary embodiments, current flowing through the hybrid contact only enters and exits through the top and bottom of the hybrid contact 252. In other words, in these embodiments, no horizontal interconnects or other conductors carry current into or out of the hybrid contact 252 between or in the upper dielectric layer 244 and the intermediate dielectric layer 222. Of course, other embodiments in accordance with the present technique may include horizontal interconnects or conductors that conduct current into and out of the hybrid contact 252 at intermediate positions along its length. Additionally, or alternatively, certain other embodiments may include another contact or plug directly above the hybrid contact 252 to conduct current into and/or out of the hybrid contact 252.

In conclusion, an exemplary two-stage contact formation process may be used to form an embodiment of a hybrid contact. Certain less critical features, such as an upper portion of the exemplary hybrid contact, may be formed with older generation lithography systems, which may be cheaper, and certain more critical features, such as a lower portion of the exemplary hybrid contacts, may be formed with newer generation lithography systems. Advantageously, if the lower portion of such an exemplary hybrid contact is formed in a layer that includes other critical features, or if the lower portion is formed at substantially the same time as other critical features, the marginal cost of patterning the lower portion of the exemplary hybrid contact along with the other critical features may be very low, as the newer generation of lithography system would likely be used to pattern this layer or these features anyway. Consequently, some embodiments of the present technique may reduce manufacturing costs.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
an initial patterned layer comprising a target conductor and a first capacitor plug formed therein;
a first bottom capacitor plate formed on and in electrical contact with the first capacitor plug, the first bottom capacitor plate having a first height;
a first capacitor dielectric formed on a top surface, an outward-facing surface, and an inward-facing surface of the first bottom capacitor plate;
a top capacitor plate formed on the first capacitor dielectric, wherein a top surface of the top capacitor plate reaches a second height greater than the first height;
a top capacitor contact formed on and in electrical contact with the top capacitor plate;
a lower vertical contact formed on and in electrical contact with the target conductor, the lower vertical contact having the first height and a first width, wherein a top surface of the lower vertical contact is lower than the top surface of the top capacitor plate; and
an upper vertical contact formed on and in electrical contact with the lower vertical contact, the upper vertical contact having a second width that is greater than the first width.

2. The device of claim 1, wherein the top surface of the first bottom capacitor plate is planar with the top surface of the lower vertical contact.

3. The device of claim 1, wherein the second width is at least two times the first width.

4. The device of claim 1, wherein the first bottom capacitor plate has a U-shape.

5. The device of claim 1, wherein the device comprises a memory device.

6. The device of claim 1, wherein the initial patterned layer comprises a second capacitor plug formed therein and the device comprises:
a second bottom capacitor plate formed on and in electrical contact with the second capacitor plug, the second bottom capacitor plate having the first height; and
a second capacitor dielectric formed on a top surface, an outward-facing surface, and an inward-facing surface of the second bottom capacitor plate;
wherein the top capacitor plate is also formed on the second capacitor dielectric.

7. A device, comprising:
an initial patterned layer comprising a target conductor and a capacitor plug formed therein;

a bottom capacitor plate formed on and in electrical contact with the capacitor plug, the bottom capacitor plate having a first height;

a lower vertical contact formed on and in electrical contact with the target conductor, the lower vertical contact having the first height and a first width; and an upper vertical contact formed on and in electrical contact with the lower vertical contact, the upper vertical contact having a second width that is greater than the first width;

wherein an alignment tolerance of the upper vertical contact to the lower vertical contact is greater than 1.5 times an alignment tolerance of the lower vertical contact to the target conductor.

8. A device, comprising:

a lowest substrate under which no patterned layer is disposed;

an initial patterned layer directly on the substrate, the initial patterned layer including a target conductor and a capacitor plug formed therein; and an intermediate dielectric layer directly on the initial patterned layer, the intermediate dielectric layer having a first height and having therein:

a capacitor shaping recess formed entirely in the intermediate dielectric layer positioned over the capacitor plug, wherein the capacitor shaping recess has sidewalls that extend completely from the initial patterned layer to a top of the intermediate dielectric layer; and a lower-contact recess formed entirely in the intermediate dielectric layer, the lower-contact recess positioned on the target conductor, wherein the lower contact-recess has sidewalls that extend completely from the initial patterned layer to the top of the intermediate dielectric layer;

wherein the capacitor shaping recess does not extend above the intermediate dielectric layer.

9. The device of claim 8, wherein the target conductor comprises a protective cap at the top of the target conductor.

10. The device of claim 8, wherein no films are adjacent the surface of the intermediate dielectric layer, whereby the surface of the intermediate dielectric layer is exposed.

11. The device of claim 8, wherein the target conductor is a local interconnect that extends generally horizontally.

12. The device of claim 8, wherein at least a portion of the intermediate dielectric layer is greater than 1 micron in thickness in a direction perpendicular to the surface of the substrate.

13. The device of claim 8, comprising conductive film adjacent a surface of the intermediate dielectric layer, the surface of the intermediate dielectric layer including sidewalls of the capacitor shaping recess and at least a portion of sidewalls of the lower-contact recess, wherein the conductive film is configured to form a bottom plate of a capacitor, and wherein the surface of the intermediate dielectric layer adjacent the conductive film is not necessarily contiguous.

14. The device of claim 8, wherein:

the substrate comprises silicon, the target conductor comprises a nitride cap; and the intermediate dielectric layer comprises BPSG.

15. A device, comprising:

a local interconnect in a lower dielectric material;

a plurality of capacitor plugs in the lower dielectric material;

a plurality of bottom capacitor plates directly on respective capacitor plugs;

a common top capacitor plate disposed on the plurality of bottom capacitor plates but separated from the plurality of bottom capacitor plates by at least one capacitor dielectric material; and a hybrid-vertical contact directly on the local interconnect, such that the hybrid-vertical contact is electrically coupled to the local interconnect, wherein the hybrid-vertical contact comprises:

a lower-vertical contact through an intermediate dielectric material formed on the lower dielectric material, wherein the lower-vertical contact is formed directly on the local interconnect, the lower-vertical contact having a uniform lower width; and an upper-vertical contact through an upper dielectric material formed on the intermediate dielectric material, wherein the upper-vertical contact is formed directly on the lower-vertical contact, the upper-vertical contact having an upper width greater than the lower width.

16. The device of claim 15, wherein the local interconnect is located in a periphery portion of the lower patterned layer.

17. The device of claim 15, wherein the local interconnect is a buried digit line.

18. The device of claim 15, comprising a horizontal interconnect directly on the upper-vertical contact.

19. The device of claim 18, wherein the hybrid vertical contact is insulated from conductors other than the target conductor and the horizontal interconnect.

20. The device of claim 18, wherein the horizontal interconnect is a metal.

21. The device of claim 15, wherein the upper width is at least twice the lower width.

22. The device of claim 15, wherein the lower-vertical contact is centered below the upper-vertical contact.

23. A device, comprising:

a local interconnect in a lower dielectric material;

a capacitor plug in the lower dielectric material;

a bottom capacitor plate directly on the capacitor plug; and a hybrid-vertical contact directly on the local interconnect, such that the hybrid-vertical contact is electrically coupled to the local interconnect, wherein the hybrid-vertical contact comprises:

a lower-vertical contact through an intermediate dielectric material formed on the lower dielectric material, wherein the lower-vertical contact is formed directly on the local interconnect, the lower-vertical contact having a uniform lower width; and an upper-vertical contact through an upper dielectric material formed on the intermediate dielectric material, wherein the upper-vertical contact is formed directly on the lower-vertical contact;

wherein an alignment tolerance of the upper-vertical contact to the lower-vertical contact is greater than 1.5 times an alignment tolerance of the lower vertical contact to the local interconnect.

* * * * *